(12) United States Patent
Fukaya et al.

(10) Patent No.: US 9,268,212 B2
(45) Date of Patent: *Feb. 23, 2016

(54) PHOTOMASK BLANK AND METHOD FOR MANUFACTURING PHOTOMASK

(71) Applicant: Shin-Etsu Chemical Co., Ltd., Chiyoda-ku (JP)

(72) Inventors: Souichi Fukaya, Niigata (JP); Hideo Nakagawa, Niigata (JP); Kouhei Sasamoto, Niigata (JP)

(73) Assignee: SHIN-ETSU CHEMICAL CO., LTD., Chiyoda-ku (JP)

( * ) Notice: Subject to any disclaimer, the term of this patent is extended or adjusted under 35 U.S.C. 154(b) by 229 days.

This patent is subject to a terminal disclaimer.

(21) Appl. No.: 13/892,543

(22) Filed: May 13, 2013

(65) Prior Publication Data
US 2013/0309600 A1 Nov. 21, 2013

(30) Foreign Application Priority Data
May 16, 2012 (JP) .................................. 2012-112518

(51) Int. Cl.
*G03F 1/26* (2012.01)
*G03F 1/50* (2012.01)
*G03F 1/32* (2012.01)
(Continued)

(52) U.S. Cl.
CPC .. *G03F 1/50* (2013.01); *G03F 1/26* (2013.01); *G03F 1/32* (2013.01); *G03F 1/80* (2013.01); *G03F 1/54* (2013.01)

(58) Field of Classification Search
CPC ..................................... G03F 1/50; G03F 1/80
USPC ................................................................ 430/5
See application file for complete search history.

(56) References Cited

U.S. PATENT DOCUMENTS

2004/0058252 A1    3/2004  Mathuni et al.
2006/0251973 A1*  11/2006  Takaki et al. ..................... 430/5
(Continued)

FOREIGN PATENT DOCUMENTS

EP     1 801 647 A1    6/2007
JP      61-138257       6/1986
(Continued)

OTHER PUBLICATIONS

Extended European Search Report issued Sep. 6, 2013 in Patent Application No. 13167565.4.
(Continued)

*Primary Examiner* — Jonathan Jelsma
(74) *Attorney, Agent, or Firm* — Oblon, McClelland, Maier & Neustadt, L.L.P.

(57) ABSTRACT

A light-shielding film 2 is formed on a transparent substrate 1. A hard mask film 3 is formed on this light-shielding film 2. The entire hard mask film 3 is made of a chromium-containing material including tin. The film made a chromium-containing material including tin can cause a significant increase in the etching rate at the time of chlorine-containing dry etching. Furthermore, comparing with a film made of a chromium-containing material in which part of chromium is replaced with a light element, the above film has an equal or higher level of etching resistance to fluorine-dry etching. Thus, burden on a photoresist at the time of etching the chromium-containing material film can be reduced. Therefore, high-precision pattern transfer can be performed even in the case that the resist film is thinned.

16 Claims, 6 Drawing Sheets

(51) Int. Cl.
  *G03F 1/80* (2012.01)
  *G03F 1/54* (2012.01)

(56) References Cited

U.S. PATENT DOCUMENTS

| | | |
|---|---|---|
| 2007/0212619 A1 | 9/2007 | Yoshikawa et al. |
| 2008/0063950 A1 | 3/2008 | Yoshikawa et al. |
| 2012/0034551 A1 | 2/2012 | Yoshikawa et al. |
| 2013/0230796 A1* | 9/2013 | Yoshikawa et al. ............ 430/5 |

FOREIGN PATENT DOCUMENTS

| | | |
|---|---|---|
| JP | 63-58446 A | 3/1988 |
| JP | 63-166231 A | 7/1988 |
| JP | 2006-78807 | 3/2006 |
| JP | 2007-33470 | 2/2007 |
| JP | 2007-241060 | 9/2007 |
| JP | 2009-92823 A | 4/2009 |
| JP | 2010-9001 A | 1/2010 |
| JP | 2012-53458 | 3/2012 |
| TW | 201001055 A1 | 1/2010 |
| WO | WO 2006/030627 A1 | 3/2006 |
| WO | WO 2012/070209 A1 | 5/2012 |

OTHER PUBLICATIONS

Office Action issued Mar. 31, 2015 in Japanese Patent Application No. 2012-112518.
Office Action dated Jul. 13, 2015, issued in corresponding Chinese patent application No. 201310182144.9.

* cited by examiner

PHOTOMASK BLANK AND METHOD FOR MANUFACTURING PHOTOMASK

CROSS-REFERENCE TO RELATED APPLICATION

The present application claims the benefit of the filing date of Japanese application no. 2012-112518, filed on May 16, 2012.

TECHNICAL FIELD

The present invention relates to a photomask blank for a photomask used in manufacture of a semiconductor integrated circuit or the like. More specifically, the present invention relates to a photomask blank having a hard mask film as a mask-pattern processing auxiliary film, and a method for manufacturing a photomask using such a mask blank.

BACKGROUND ART

In the field of semiconductor technology, research and development for further refinement of patterns have been progressed. In recent years, particularly, with high integration of a large scale integration circuit, refinement of circuit patterns, wiring patterns, or contact-hole patterns for wiring between layers forming a cell has been progressed, and a request for microfabrication technology has been increased.

In connection with this, even in the field of technology for photomask production to be used in the process for photolithography in microfabrication, a technique for forming fine and correct circuit patterns (mask patterns) has begun to be demanded.

Generally, reduction projection is performed when forming a pattern on a semiconductor substrate by photolithographic technique. The size of the pattern formed on the photomask is therefore approximately four times larger than the side of the pattern formed on the semiconductor substrate. However, this does not mean that the desired precision of the pattern formed on the photomask is smaller than the pattern formed on the semiconductor substrate. Rather, the precision of a pattern formed on the photomask as a master is desired to be higher more than an actual pattern obtained after exposure.

In today's photolithography technical field, the size of a circuit pattern to be drawn is considerably smaller than the wavelength of light to be used for exposure. Thus, in the case of forming a photomask pattern with a just four-times larger circuit pattern, light interference or the like, which is generated under exposure, influences on transfer of an original shape. As a result, the original shape cannot be transferred onto the resist film of a semiconductor substrate.

In some cases, therefore, a pattern formed on the photomask is made more complicated than an actual circuit pattern to reduce an effect of the above light interference or the like. The shape of such a pattern may be, for example, an actual circuit pattern subjected to optical proximity correction (OPC).

Hence, along with a decrease in size of a circuit pattern, a higher precision processing technique has been also desired in a lithographic technique for forming photomask patterns. Although lithography performance may be expressed in limiting resolution, as described above, the precision of a pattern formed on the photomask as a master is desired to be higher more than an actual pattern obtained after exposure. Thus, limiting resolution required for formation of a photomask pattern is almost equal to or higher than one required in lithography for forming a pattern on a semiconductor base.

In general, when forming a photomask pattern, a resist film is formed on the surface of the photomask blank in which a light-shielding film is mounted on a transparent substrate, and a pattern is then drawn (exposed) on the resist film by an electron beam. Subsequently, after obtaining a resist pattern after developing the exposed resist film, the light-shielding film is etched by using this resist pattern as a mask to obtain a light-shielding (film) pattern. The light-shielding (film) pattern thus obtained is served as a photomask pattern.

In this case, the above resist film should be thinned depending on the degree of fineness of the light-shielding pattern. This is because, when forming a fine light-shielding pattern while keeping the thickness of the resist film, the ratio (aspect ratio) of the thickness of the resist film to the size of the light-shielding pattern becomes large and causes troubles of failed pattern transfer, falling down or peeling off of the resist pattern, or the like due to deterioration of the shape of the resist pattern.

On the other hand, in the conventional photomask blank, when patterning is performed by making the resist film thinner, damage received by the resist in etching process may cause deterioration or regression of the pattern shape. In this case, a resist pattern cannot be correctly transferred to a light-shielding film, and a photomask with high patterning precision cannot be made. Thus, various investigations have been performed with respect to a photomask blank having a structure that enables high-precision patterning even if a resist film is made thinner.

For example, in JP 2006-78807 A (Patent Document 1), there is disclosed a light-shielding film having a structure in which at least one layer is made of a material mainly containing silicon and a transition metal and having an atomic ratio of silicon and metal of 4 to 15:1 (silicon: metal). The layer made of a material containing silicon and a transition metal can be processed by fluorine-containing dry etching. The fluorine-containing dry etching has a low level of damage to a resist pattern. Thus, employing the above structure may lead to a light-shielding film for ArF exposure having excellent light-shielding ability and processability.

In JP 2007-241060 A (Patent Literature 2), there is disclosed a method for further enhancing processability of a light-shielding film containing silicon and a transition metal by using a hard mask as a thin film made of a chromium-containing material.

Conventionally, as an optical film such as a light-shielding film and a half-tone phase shift film, a transition-metal compound film and a silicon compound film have been used. Here, the transition-metal compound film includes a transition metal and a light element such as oxygen, nitrogen, or carbon, which can be selected as appropriate. Especially, a chromium-containing material film and a molybdenum silicon-containing material film have been widely used as an optical film.

In the case that a light-shielding film is a film made of a chromium-containing material, if a resist film for patterning this light-shielding film is made thin, it becomes difficult to fully secure the etching resistance of the light-shielding film in patterning process. In Patent Literature 2, therefore, to make fine pattern processing possible even when a resist film is made thin, a photomask blank is proposed so that a light-shielding film is a film made of a material processable with fluorine-containing dry etching.

Using a thin chromium compound film as a hard mask film is also disclosed by this Patent Literature 2 in order to perform precise patterning to the light-shielding film which comprises a transition metal silicon compound. Using a thin chromium compound film as a hard mask film is also disclosed.

Although the hard mask film made of such a chromium compound is patterned by transferring a resist pattern, it is supposed that the precision of such patterning can be secured by sufficiently reducing the thickness of the hard mask film.

CITATION LIST

Patent Literatures

Patent Literature 1: JP 2006-78807 A
Patent Literature 2: JP 2007-241060 A
Patent Literature 3: JP 2007-33470 A
Patent Literature 4: JP 61-138257 A
Patent Literature 5: JP 2012-53458A

SUMMARY OF THE INVENTION

Technical Program

However, there is a possibility of causing insufficient etching resistance of a hard mask film when etching a film under the hard mask film by only sufficiently reducing the thickness of the hard mask film to secure high precision of patterning. In addition, it is very difficult to improve etching resistance while maintaining high resolution from the side of a photoresist material.

Therefore, in the case that a film made of a chromium-containing material is provided as a hard mask film, there is a need of enhancing the etching processability as well as improving an etching rate at the time of carrying out dry etching on a hard mask film made of a chromium-containing material by a method different from the conventional one.

Conventionally, a chromium-containing material film has been widely used as a light-shielding film of a photomask blank. There are reported cases about a method for improving processability. For example, Patent Literature 3 (JP 2007-33470 A) discloses the invention of a photomask blank where its composition, film thickness, and a laminated structure are suitably designed to obtain desired transmittance T and reflectance R while trying to increases a dry-etching rate by making the composition of a chromium-containing compound of the light-shielding film rich in light element and low in chromium composition as compared with the composition of the conventional film.

However, there is a problem that such a chromium-containing material of rich in light element and low in chromium composition should have a large film thickness for the purpose of a decrease in etching resistance to fluorine-containing dry etching and assure a sufficient function as a hard mask film.

In other words, in order to provide a photomask blank in response to the request for further miniaturization and high-precision of lithography technology for formation of photomask pattern in recent years, it has been desired to provide a technique, which is different from the conventional one, for sufficiently securing the etching resistance of a hard mask film made of a chromium material while improving an etching rate at the time of chlorine-containing dry etching.

The present invention has been made in consideration of the above problem and an object thereof is to assure various characteristics such as chemical characteristics required for a hard mask film made of a chromium-containing material and to reduce burden on a photoresist at the time of etching the chromium-containing material film, thereby making high-precision pattern transfer possible even in the case that the resist film is thinned.

Solution to Problem

In order to solve the above problem, the photomask blank according to the present invention includes a hard mask film made of a chromium-containing material including tin on an inorganic material film configured to be etched by fluorine-containing dry etching, the inorganic material film containing one or more elements selected from a group consisting of molybdenum, tantalum, hafnium, niobium, tungsten, and silicon.

Preferably, the chromium-containing material including tin has a content of tin of not under 0.01 times and not over 2 times than the content of chromium in atomic ratio.

Preferably, the chromium-containing material including tin is any one of a tin-chromium metal, tin-chromium oxide, tin-chromium nitride, tin-chromium carbide, tin-chromium oxide nitride, tin-chromium oxide carbide, tin-chromium nitride carbide, and tin-chromium oxide nitride carbide.

It is preferred that the inorganic material film which can be etched with the fluorine-containing dry etching be a silicon-containing material including molybdenum and silicon.

Furthermore, it is preferred that the film containing molybdenum and silicon be a light-shielding film.

The method for manufacturing a photomask according to the present invention comprises the steps of; forming a hard mask pattern by subjecting the hard mask film to chlorine-containing dry etching by using the above blank; and transferring a pattern to the inorganic material film by fluorine-containing dry etching using the hard mask pattern as an etching mask.

Advantageous Effects of Invention

The present invention has employed a structure including a hard mask film made of a chromium-containing material including tin on an inorganic material film configured to be etched by fluorine-containing dry etching, the inorganic material film containing one or more elements selected from a group consisting of molybdenum, tantalum, hafnium, niobium, tungsten, and silicon.

The film made a chromium-containing material including tin can cause a significant increase in the etching rate at the time of chlorine-containing dry etching. In addition, such a film shows etching resistance to fluorine-containing dry etching at a level equal to or higher than that of the chlorine-containing dry etching.

Thus, at the time of processing a photomask blank according to the present invention, burden on a photoresist at the time of etching the chromium-containing material film can be reduced. Therefore, high-precision pattern transfer can be performed even in the case that the resist film is thinned.

DESCRIPTION OF EMBODIMENTS

Figure 1:
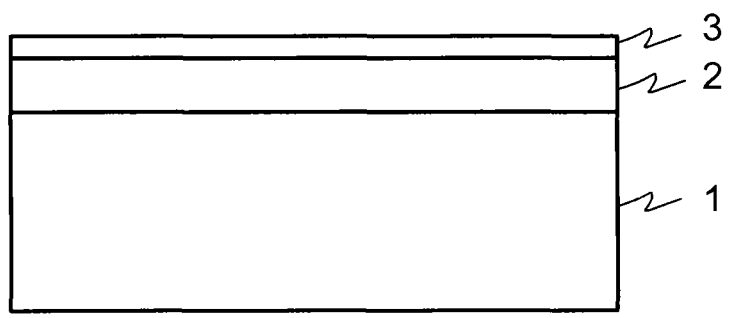
FIG. 1 is a cross-sectional diagram illustrating the configuration of a photomask blank according to an embodiment of the present invention.

Hereinafter, an embodiment of the present invention will be described with reference to drawings.

The hard mask film made of a chromium-containing material including tin is applicable to a reflection-type photomask as well as a transmission-type photomask. In the following description, however, a transmission-type photomask will be described as an example.

As described above, in the case that an optical film such as a light-shielding film or a phase shift film, which is a structural element of a photomask blank, is made of a material capable of being etched by fluorine-containing dry etching, a hard mask film made of a chromium-containing material is used as a process auxiliary film for patterning this optical film with high precision (see, for example, Patent Literature 2).

Such a hard mask film is used as a substitution of a resist pattern when processing accuracy decreases due to insufficiently secured etching resistance of the resist pattern. Thus, materials for the hard mask film are selected from those having high etching resistance under etching conditions for patterning a film serving as an etching target (process film) and having physical properties that substantially prevent the etched process film from being damaged at the time of removal of the hard mask film.

When the process material is, for example, a film which is processable by fluorine-containing dry etching, such as a film containing at least one element selected from molybdenum, tantalum, hafnium, niobium, tungsten, and silicon, a chromium-containing material has been conventionally used for the hard mask film provided on this film to be processed. The chromium-containing material shows high etching resistance to fluorine-containing dry etching, and by adjusting the amount of oxygen to be added at the time of chlorine-containing dry etching, it is possible to remove the hard mask from the process film substantially without any damage.

However, when thinning of a photoresist film proceeds as miniaturization of a mask pattern proceeds, the hard mask film has to be miniaturized. Thus, the conventional chromium-containing material becomes difficult to sufficiently ensure its function as a hard mask film.

In order to provide a photomask blank in response to the request for further miniaturization and high-precision of lithography technology for formation of photomask pattern in recent years, it is necessary to increase an etching rate of etching an optical film made of a chromium-containing material by a technique different from the conventional one while ensuring various characteristics of such an optical film.

The present inventors have investigated with respect to an increase in dry-etching rate of a film made of a chromium-containing material, and as a result the present inventors have completed the present invention by finding out that the dry-etching rate to chlorine-containing dry etching can be significantly increased by including tin into a chromium-containing material.

The photomask blank of the present invention includes: a hard mask film made of a chromium-containing material including tin on an inorganic material film made of at least one element selected from the group of molybdenum, tantalum, hafnium, niobium, tungsten, and silicon, capable of being etched by fluorine-containing dry etching.

Incidentally, when forming a chromium-containing material film by sputtering, it is common that the chromium target of the high grade which does not contain a metal impurity is used. In general, this is due to the reasons such as an empirically known fact that a decrease in etching rate of the chromium-containing material film occurs when a metal impurity is mixed into a chromium-containing material film formed by sputtering.

The present inventors have repeatedly performed various examinations on a novel procedure for increasing the dry-etching rate of a film made of a chromium-containing material while assuring design flexibility of the film. As a result, the present inventors have completed the present invention by finding out that, when tin is included in the chromium-containing material film, an increase in etching rate occurs at the time of carrying out chlorine-containing dry etching including oxygen.

In other words, conventionally film formation of a chromium-containing material film is performed to avoid contamination of metal impurities in the film by using a high-purity chromium target so that the etching rate of the chromium-containing material film is prevented from decreasing. In contrast, based on the above new finding, the present inventors have decided to perform film formation so that tin is intentionally added to a chromium-containing material film.

According to the investigation of the present inventors, the content (concentration) of tin in a chromium-containing material film is preferably not under 0.01 times, more preferably not under 0.1 times, further preferably not under 0.3 times than the content of chromium in atomic ratio.

A chromium-containing material film where the content of tin is not under 0.01 times than that of chromium in atomic ratio shows a significantly increased etching rate under general conditions for chlorine-containing dry etching. This effect becomes large as the content of tin increases. The upper limit of the content of tin is not particularly limited. However, an excess content of tin may lead to a difficulty in obtaining a film having substantially the same characteristics as those of a tin-free chromium-containing material. Thus, the content of tin is preferably not over 2 times, more preferably not over 1.5 times than that of chromium in atomic ratio.

The content ratio of tin to chromium in a hard mask film made of a chromium-containing material including tin may be constant in a depth direction of the hard mask film. Alternatively, it may have a profile which has a concentration change in the depth direction.

For example, the hard mask film may be of a multilayer structure. In this case, if the upper layer is designed to be a tin-free layer or a layer having a low tin content ratio and the lower layer is designed to be a layer having a high tin content ratio only the etching rate of the lower layer (on the substrate side) can be increased in contrast to the etching rate of the upper layer (on the surface side). Thus, an over etching time can be set short. On the other hand, when the light-shielding film is designed so that the tin content ratio is lower at the substrate side, it is possible to easily detect the end by monitoring of chromium at the time of dry-etching.

The above chromium-containing material containing tin is any one of chromium compounds, such as a tin-chromium metal, tin-chromium oxide, tin-chromium nitride, tin-chromium carbide, tin-chromium oxide nitride, tin-chromium oxide carbide, tin-chromium nitride carbide, and tin-chromium oxide nitride carbide. Among them, tin-chromium nitride, tin-chromium oxide nitride, and tin-chromium oxide nitride carbide are particularly preferred.

The hard mask film may be configured so that a film thickness region of, for example, 50% or lower, preferably 25% or lower is made of a chromium-containing material free of tin.

In this case, examples of a tin-free chromium-containing material include a chromium metal and chromium compounds such as chromium oxide, chromium nitride, chromium carbide, chromium oxide nitride, chromium oxide carbide, chromium nitride carbide, and chromium oxide nitride carbide. Among them, chromium nitride, chromium on/nitride, and chromium oxide nitride carbide are particularly preferred.

Although the hard mask film made of a chromium-containing material including tin, which is employed in the present invention, can be formed according to a publicly known method for forming a typical chromium-containing material film (see, for example, Patent Literatures 1, 2, and 3), a film excellent in uniformity can be easily obtained using a sputtering method such as DC sputtering or RF sputtering.

When carrying out sputtering film formation of a hard mask film made of a chromium-containing material including tin, a chromium target added with tin (tin-added chromium target) may be used. The chromium target and the tin target may be independently provided to perform co-sputtering (simultaneous sputtering). Alternatively, a complex target having a chromium region and a tin region in a single target may be used. Furthermore, co-sputtering may be performed using both the above complex target and the chromium target.

In the case of adding tin to the chromium target, it may be added as a metal tin or may be added as a tin compound such as tin oxide, tin nitride, or ITO.

In the case of carrying out co-sputtering using both a tin-containing target and a tin-free target, the concentration of tin in an inorganic material film can be adjusted not only by controlling the surface area ratios of the respective targets but also by controlling electric power to be applied o each target.

Particularly, if there is a need of changing the ratio of chromium between the chromium-containing material layers including tin or a need of gradual change in ratio of chromium to tin in a single layer, co-sputtering is performed using a combination of a tin-containing target and a tin-free target or a combination of targets with different tin contents to change an applied power ratio between the targets. As a result, layers with different desired tin content ratios can be formed.

The sputtering gas used in film formation of the hard mask film of the present invention is suitably selected according to the composition of the film. Preferably a light element, specifically preferably nitrogen is included in a film to increase the adhesiveness of the film or prevent the film from side-etching in process of fluorine-containing dry etching. In order to introduction of such a light element, the use of reactive sputtering with sputtering gas and the addition of one or more elements selected from oxygen, nitrogen, and carbon are performed just as in the case with the film-formation of a publicly known chromium-containing material film.

For example, only argon gas may be used when the film-formation of a tin-containing inorganic material film that does not contain a light element is performed. In the case of film-formation of a hard mask film containing a light element, reactive sputtering may be performed in one or more kinds of reactive gas, such as nitrogen gas, nitrogen oxide gas, oxygen gas, carbon oxide gas, or hydrocarbon gas, or mixture gas of any of those reactive gas and inert gas such as argon. The reactive sputtering may be performed on a film containing 5% or higher of nitrogen to prevent the film from side-etching under the conditions for fluorine-containing dry etching.

The flow rate of sputtering gas is adjusted suitably. The gas flow rate may be constant in the process of film-formation. Alternatively, the gas flow rate may be changed according to the target composition when there is a need of changing the amount of oxygen or the amount of nitrogen in a thickness direction.

The hard mask film formed on the photomask blank of the present invention can be provided with a sufficient etching mask function as long as it has a film thickness of 1 to 30 nm. In order to make lower crude density dependence at the time of processing the hard mask film, it is preferred to have a film thickness of 1 to 20 nm, particularly preferably 1 to 10 nm.

Such a hard mask film is provided on the film processed by fluorine-containing dry etching, and patterning of a lower film is performed by the hard mask pattern.

Various kinds of a film to be processed by fluorine-containing dry etching are known. An example of such a film may be one including one or more elements as metal components selected from molybdenum, tantalum, hafnium, niobium, tungsten, and silicon. Furthermore, such a film may contain a light element component such as oxygen, nitrogen, or carbon.

When the film processed by fluorine-containing dry etching is a light-shielding film, a material containing a transition metal and silicon such as a material containing molybdenum and silicon (see, for example, Patent Literature 2), a material containing tantalum (Patent Document 4: JP 61-138257 A), and the like are frequently used. In general, these light-shielding film materials are added with light elements to adjust their various physical properties, such as adhesiveness and physical properties for serving as optical films. Among them, a material containing molybdenum and silicon is preferably used as a light-shielding film material because of its excellent optical characteristics and processability.

The hard mask film made of a chromium-containing material including tin, which is employed in the present invention, is also applicable to patterning of any film to be processed by fluorine-containing dry etching. A typical example of such a film may be a light-shielding film.

Hereinafter, therefore, an example of processing a light-shielding film made of a silicon-containing material including molybdenum by using a pattern of a hard mask film made of a chromium-containing material including tin will be briefly described.

When using as a photomask the light-shielding film provided on a transparent substrate, it has a function which shades exposure light substantially in a pattern formation part and prevents sensitization of photoresist film.

In the case that a light-shielding film material is a silicon-containing material including molybdenum, it is designed for a binary mask so that the light-shielding film has an optical density of 2.3 or higher in general, preferably 2.5 or higher, more preferably 3.0 or higher against exposure light when it is used as a photomask. Furthermore, in the case of providing the light-shielding film on a half-tone phase shift film, it is designed so that a combination of the half-tone phase shift film and the light-shielding film has an optical density of generally 2.3 or higher, preferably 2.5 or higher, more preferably 3.0 or higher. In general, furthermore, a layer having a lower optical density is formed on the surface side, or the side opposite to a substrate, of the light-shielding film to provide the light-shielding film with a reflection-preventing function.

In the light-shielding film made of a silicon-containing material including molybdenum, if required, nitrogen or oxygen is added to molybdenum and silicon. In some cases, the light-shielding film may be a film made of a material including another light element such as carbon.

Examples of such a material of the light-shielding film include molybdenum-silicon, molybdenum-silicon oxide, molybdenum-silicon nitride, molybdenum-silicon oxide nitride, molybdenum-silicon oxide carbide, molybdenum-silicon nitride carbide, and molybdenum-silicon oxide nitride carbide.

The silicon-containing material including molybdenum can be provided with preferable processing characteristics as well as optical physical properties such as a reflection-preventing function by adjusting the amounts of nitrogen and oxygen added to the material.

A typical composition range of the silicon-containing material including molybdenum at the time of being used as a light-shielding film material, when emphasizing a light-shielding function, silicon is 10 atomic % or higher and 95% atomic % or lower, particularly 30 atomic % or higher and 95 atomic % or lower. In addition, oxygen is 0 atomic % or higher and 50% atomic % or lower, particularly 0 atomic % or higher and 30 atomic % or lower. Nitrogen is 0 atomic % or higher and 40% atomic % or lower, particularly 0 atomic % or higher and 20 atomic % or lower. Carbon is 0 atomic % or higher and 20% atomic % or lower, particularly 0 atomic % or higher and 5 atomic % or lower. Furthermore, a transition metal is 0 atomic % or higher and 35% atomic % or lower, particularly 1 atomic % or higher and 20 atomic % or lower.

In the case of a light-shielding film having a reflection-preventing function, silicon is 10 atomic % or higher and 80% atomic % or lower, particularly 30 atomic % or higher and 50 atomic % or lower. In addition, oxygen is 0 atomic % or higher and 60% atomic % or lower, particularly 0 atomic % or higher and 40 atomic % or lower. Nitrogen is 0 atomic % or higher and 57% atomic % or lower, particularly 20 atomic % or higher and 50 atomic % or lower. Carbon is 0 atomic % or higher and 20% atomic % or lower, particularly 0 atomic % or higher and 5 atomic % or lower. Furthermore, a transition metal is 0 atomic % or higher and 35% atomic % or lower, particularly 1 atomic % or higher and 20 atomic % or lower.

For preparing a binary mask to be used for making a fine pattern with high precision, it is preferred to make a light-shielding film thin as possible. Patent Literature 5 (JP 2012-53458 A) discloses thinning of a light-shielding film made of a silicon-containing material including molybdenum. Thus, such a technique for thinning a light-shielding film is applicable to the photomask blank of the present invention.

Specifically, a light-shielding film is not designed in different ways that respectively emphasize on a light-shielding function and a reflection-preventing function. It is designed to make a change in content of a light element in the film so that decrease in optical density can be caused on the surface side and the substrate side of the light-shielding film. Such design of the film can keep a low reflectance of exposure light without spoiling a reflection-preventing function even in the case of thinning the light-shielding film. Thus, such film design can thin the light-shielding film by a film thickness of 35 to 60 nm.

As a method of forming a light-shielding film using a silicon-containing material including a transition element such as molybdenum, a method using sputtering is preferred from a viewpoint of obtaining a film with excellent homogeneity. In this case, any one of DC sputtering, RF sputtering, and the like is applicable. In particular, among them, DC sputtering is preferred.

For the composition ratio between a transition metal such as molybdenum and silicon, one kind of a target in which a ratio between a transition element and silicon is adjusted may be used so that a pre-determined composition of interest can be attained. Alternatively, two or more different kinds of targets may be used and a composition ratio may be adjusted by electric power applied to the targets.

A target used in such sputtering may be any of various configurations, such as a silicon target alone, which contains a transition metal; a combination of a transition metal target and a silicon target; a combination of a silicon target containing a transition metal and a silicon target; a combination of a transition metal target and a silicon target containing a transition element; and a combination of a transition metal target and a silicon target containing a transition metal target and a silicon target.

Sputtering gas used may be publicly known inert gas or reactive gas. Preferably, it is argon gas alone, or a combination of argon and nitrogen gas, nitrogen oxide gas, oxygen gas, or the like, which is selected and adjusted so that a desired composition can be obtained.

In order to adjust the light-shielding effect of the film, its dependency on light-shielding sputtering conditions and a rate of film-formation are checked beforehand. Then, based on the result, film-formation may be performed by setting sputtering conditions of a substrate-side composition gradient region, an intermediate region, and a surface-side composition gradient region of a light-shielding film so that the light-shielding film can be resulted in one provided with desired light-shielding property.

In this case, for obtaining a film in which an absorption coefficient changes stepwisely or continuously in a depth direction, for example, the composition of sputtering gas may be stepwisely or continuously changed. Furthermore, in the case of film-formation using a plurality of different targets, electric power applied to each target may be stepwisely or continuously changed to cause a stepwise or continuous change in the ratio between a transition element and silicon to control an absorption coefficient in a depth direction.

The photomask blank of the present invention may be configured to have a half-tone phase shift film if required. When any of the half-tone phase shift film and the light-shielding film is a film to be processed by fluorine-containing dry etching, an etching stopper film may be formed between the light-shielding film and the half-tone phase shift film if required.

When any of the half-tone phase shift film and the light-shielding film is a film made of a silicon-containing material including a transition metal, it is preferred that an etching stopper film be provided as a film made of a chromium-containing film. This chromium-containing material film can also be provided as a film made of a chromium-containing material including tin.

In the photomask blank of the present invention, a method for processing a film processed by fluorine-containing dry etching on a lower layer using a hard mask made of a chromium-containing material including tin is pursuant to the conventional method (see, for example, Patent Literature 2).

A film made of a chromium-containing material including tin can be dry-etched with chlorine gas containing oxygen in a manner similar to a film made of a chromium-containing material free of tin, and it shows a significantly high etching rate as compared with the film made of a chromium-containing material free of tin under the same conditions.

Dry-etching on the film made of a chromium-containing material including tin can be performed, for example, using gas of chlorine gas and oxygen gas at a mixture ratio ($Cl_2$ gas: $O_2$ gas) of 1:2 to 20:1 in terms of volumetric flow rate, and optionally mixed with inert gas such as helium.

When a film made of a chromium-containing material including tin as an etching mask is used as an etching mask and a film under such a film is then processed by fluorine-containing dry etching, for example, gas containing fluorine can be used. Examples of the gas containing fluorine include fluorine gas, gas containing carbon and fluorine (such as $CF_4$ and $C_2F_6$), and gas containing sulfur and fluorine (such as $SF_6$). Furthermore, these kinds of gas containing fluorine can be mixed with fluorine-free gas, such as helium, and used. The etching gas may be added with gas of oxygen or the like if required.

FIG. 1 is a cross-sectional diagram illustrating the configuration of a photomask blank according to an embodiment of the present invention. In the embodiment illustrated in the figure, a light-shielding film 2 is formed on transparent substrate 1. A hard mask film 3 is formed on this light-shielding film 2. In this example, the entire hard mask film 3 is made of a chromium-containing material including tin. A process for manufacturing a binary mask using such a blank can be outlined as follows.

Figure 2:
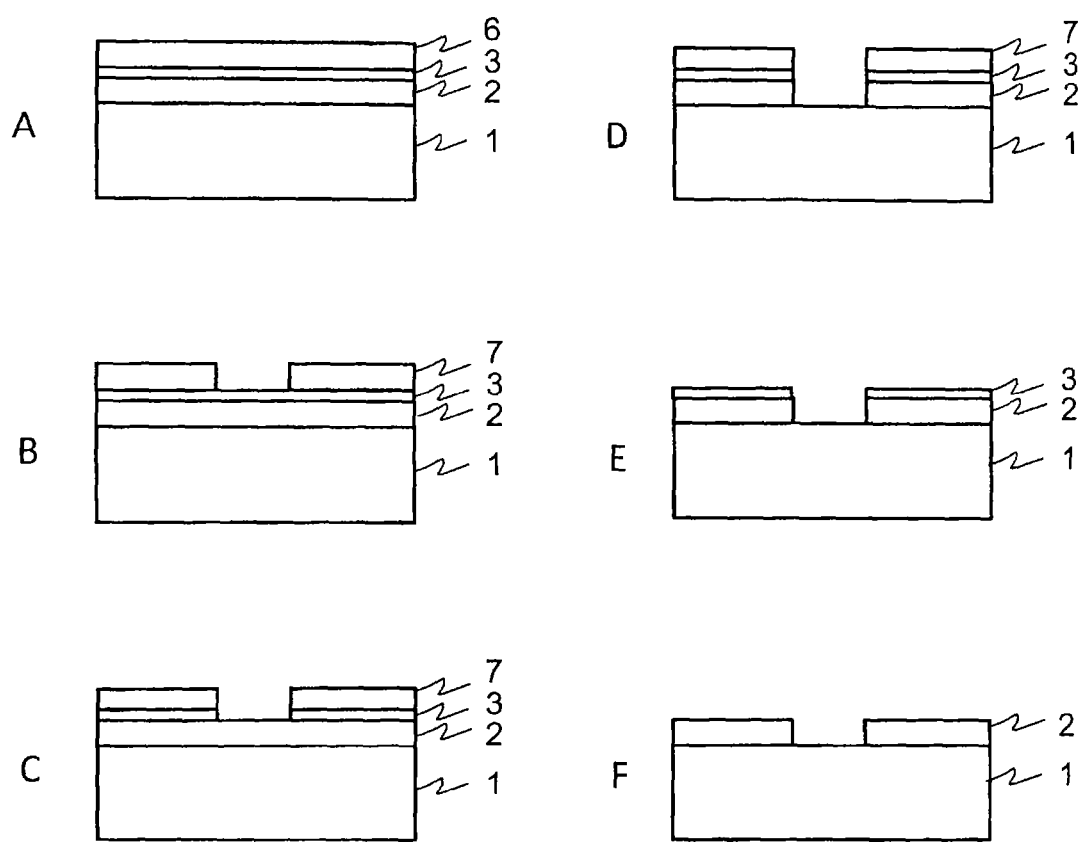
FIG. 2 is a diagram illustrating a process for manufacturing a binary mask according to an embodiment of the present invention.

FIG. 2 is a diagram illustrating an embodiment of a process for manufacturing a binary mask. First, to the hard mask film 3 of the photomask blank illustrated in the FIG. 1, a photoresist is applied to form a resist film 6 (FIG. 2A).

The resist film 6 is subjected to pattern irradiation of electron beams, and then subjected to pre-determined steps of development and so on. As a result, a resist pattern 7 is obtained (FIG. 2B).

Using this resist pattern 7 as a mask, the hard mask film 3 is patterned by chlorine-containing dry etching (FIG. 2C). At this time, the hard mask film 3 made of a chromium-containing material including tin has a high etching rate. Thus, an etching time is shortened to reduce damage of the resist pattern 7. As a result, it is high-precision pattern transfer can be performed, and a loading effect, which is a processing error due to pattern density dependency, can be also reduced.

Subsequently, using the patterned hard mask film 3 as a mask, the light-shielding film 2 is patterned by fluorine-containing dry etching (FIG. 2D). This is because the hard mask film 3 made of a chromium-containing material including tin has a sufficiently high etching resistance to fluorine-containing dry etching. Even if the hard mask film 3 is a thin film, high-precision pattern transfer can be performed.

The remaining resist pattern 7 is removed by dry etching (FIG. 2E). After removal of the hard mask film 3 by chlorine-containing dry etching including oxygen, a binary mask is completed (FIG. 2F).

Figure 3:
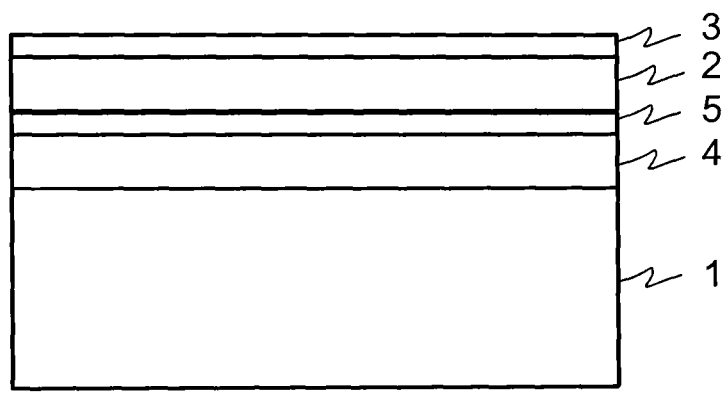
FIG. 3 is a cross-sectional diagram illustrating the configuration of a photomask blank according to another embodiment of the present invention.

FIG. 3 is a cross-sectional diagram illustrating the configuration of a photomask blank according to another embodiment of the present invention. In the embodiment illustrated in this figure, it is provided as a half-tone phase shift mask 4. A half-tone phase sift film 4 and an etching stopper film 5 are stacked on a transparent substrate 1 in this order. The light-shielding film 2 and the hard mask film 3 are formed on the etching stopper film 5.

In this example, the haft-tone phase shift film 4 is a film processable by fluorine-containing dry etching, and the etching stopper film 5 is a film made of a chromium-containing material, which may contain or not contain tin. In addition, the light-shielding film 2 is a film processable by fluorine-containing dry etching, and the entire hard mask film 3 is made of a chromium-containing material including tin.

Figure 4:
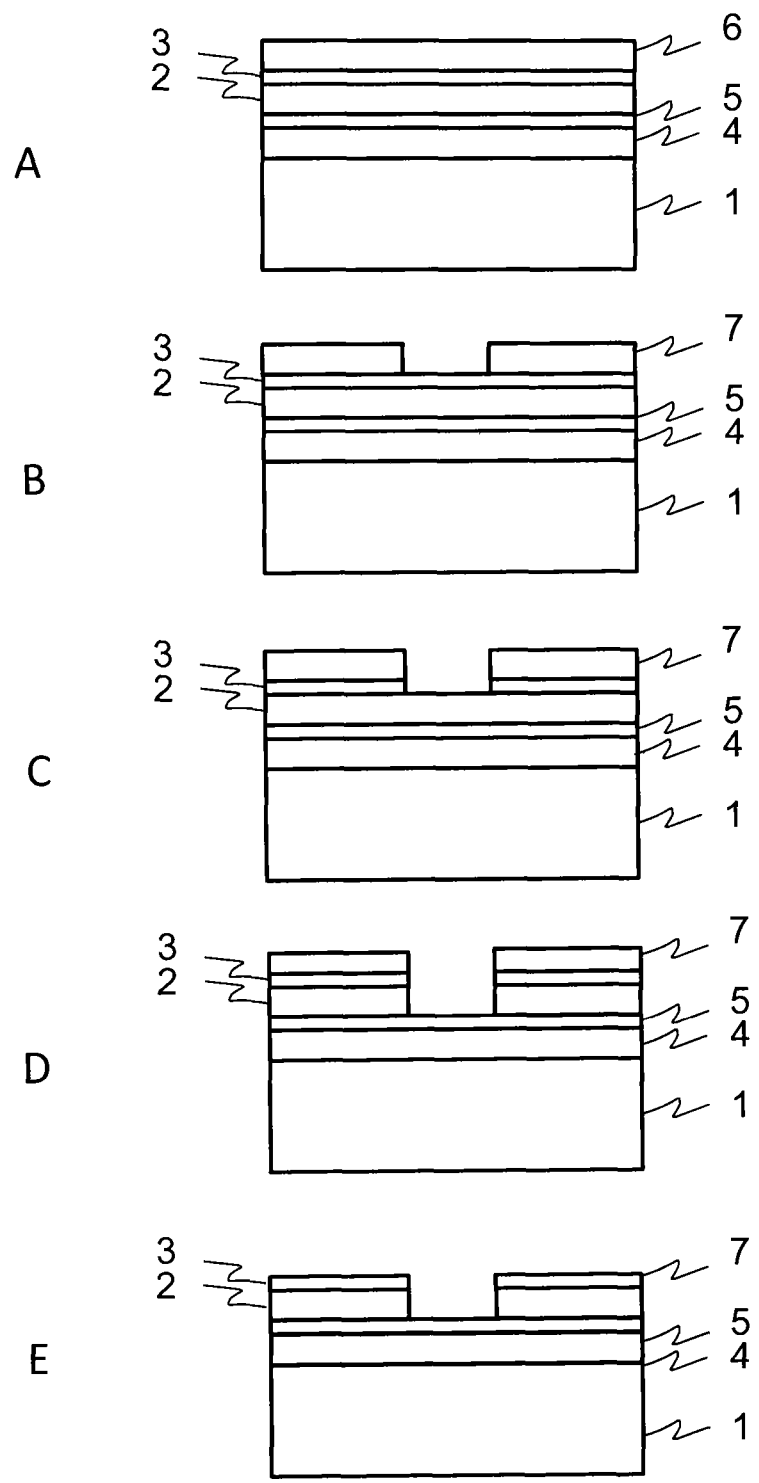
FIG. 4 is a diagram illustrating a process for manufacturing a half-tone phase shift mask according to an embodiment of the present invention (anterior half).
Figure 5:
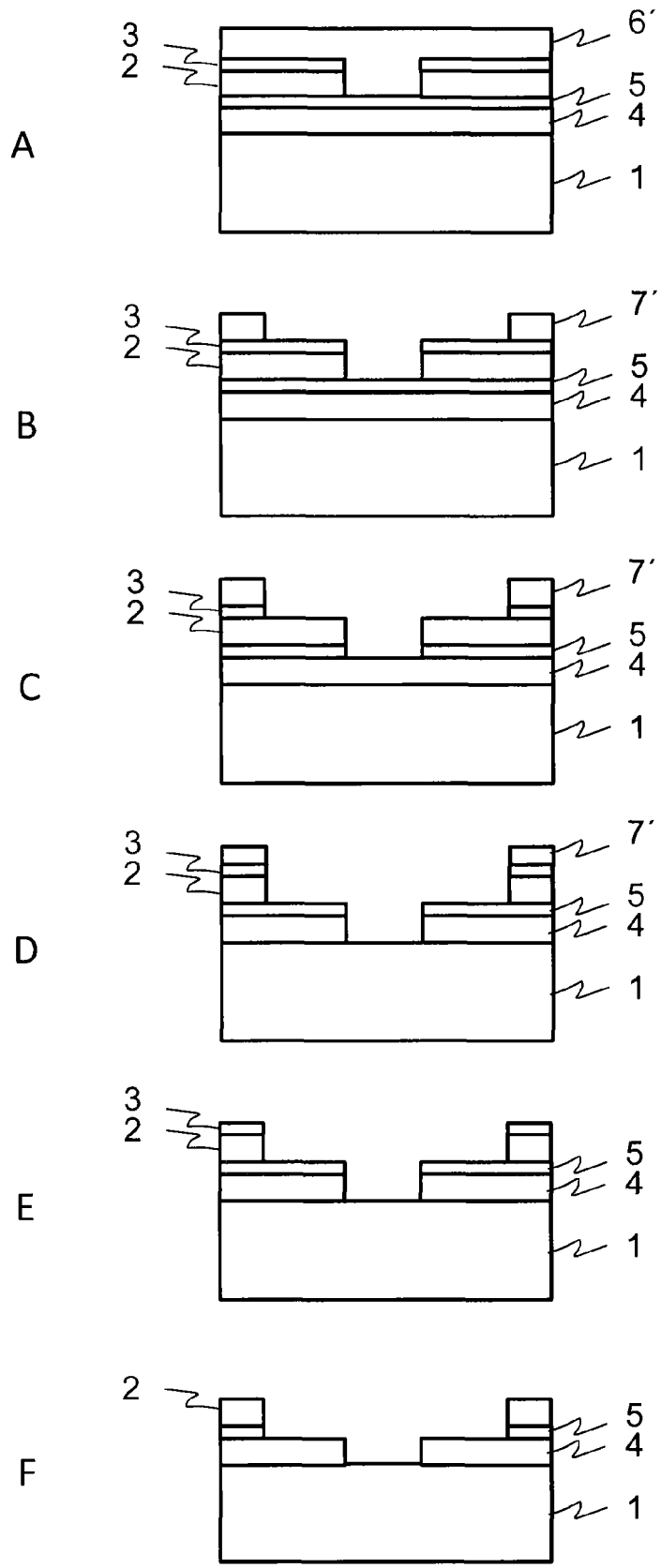
FIG. 5 is a diagram illustrating a process for manufacturing a half-tone phase shift mask according to an embodiment of the present invention (posterior half).

A process for manufacturing a half-tone phase shift mask using such a blank can be outlined as follows:

FIG. 4 and FIG. 5 are diagrams illustrating a process for manufacturing a half-tone phase shift mask according to an embodiment of the present invention. First, to the hard mask film 3 of the photomask blank illustrated in the FIG. 3, a photoresist is applied to form a resist film 6 (FIG. 4A).

Next, the resist film 6 is subjected to pattern irradiation of electron beams, and then subjected to pre-determined steps of development and so on. As a result, a resist pattern 7 having an opening at a portion from which the half-tone phase shift film 4 is desired to be removed (FIG. 4B).

Using this resist pattern 7 as a mask, the hard mask film 3 is patterned by chlorine-containing dry etching (FIG. 4C). Since hard mask film 3 which comprises a tin-containing chromium-containing material has a high etching rate at this time, an etching time is shortened to reduce damage of the resist pattern 7. As a result, it is high-precision pattern transfer can be performed, and a loading effect, which is a processing error due to pattern density dependency, can be also reduced.

Subsequently, using the patterned hard mask film 3 as a mask, the light-shielding film 2 is patterned by fluorine-containing dry etching (FIG. 4D). This is because the hard mask film 3 made of a chromium-containing material including tin has a sufficiently high etching resistance to fluorine-containing dry etching. Even if the hard mask film 3 is a thin film, high-precision pattern transfer can be performed.

The remaining resist pattern 7 is removed by dry etching (FIG. 4E).

Subsequently, a resist film 6' is formed by application of additive photoresist (FIG. 5A).

The resist film 6' is subjected to pattern irradiation of electron beams, and the subjected to pre-determined steps of development and so on. As result, a resist pattern 7' for protecting a portion of the light-shielding film 2 to be left untouched is obtained (FIG. 5B).

In this state, chlorine-containing dry etching including oxygen is performed. As a result, the hard mask film 3 at a portion without being covered with the resist pattern 7' and the etching stopper film 5 without being covered with the light-shielding film 2 are simultaneously removed (FIG. 5C).

Furthermore, if fluorine-containing dry etching is performed, a portion of the light-shielding film 2 which is not covered with the hard mask film 3 and a portion of the half-tone phase shift film 4 which is not covered with the etching stopper film 5 are simultaneously removed (FIG. 5 D).

The remaining resist pattern 7' is removed by dry etching (FIG. 5E). Subsequently, a process of chlorine-containing dry etching including oxygen removes the remaining hard mask film 3 and the undesired portion of the etching stopper film 5. As a result, a half-tone phase shift mask is completed (FIG. 5 F).

[Evaluation Experiment Dry-Etching Characteristics]

As an example of an experiment for evaluating dry-etching characteristics, film formation was performed on a square-shaped quartz substrate of 152 mm on a side and 6 mm in thickness by a DC sputtering method using co-sputtering with a chromium target and a tin target which were independently disposed to obtain two different 44-nm thick CrON films with different tin concentration.

The content of tin in the CrON film was adjusted by adjusting power individually applied to the chromium target and the tin target. Sputtering gas was a gas mixture of argon gas, oxygen gas, and nitrogen gas.

For comparison, furthermore, a tin-free CrON film was also formed using a Cr target.

Two or more of each of the above three samples of the chromium-containing material films were produced. The composition analysis of the chromium-containing material films was performed using ESCA (JPS-9000MC, manufactured by JEOL).

These samples were compared with one another with respect to an etching rate (clear time) of a 44-nm thick chromium-containing film with chlorine-containing dry etching including oxygen.

Figure 6:
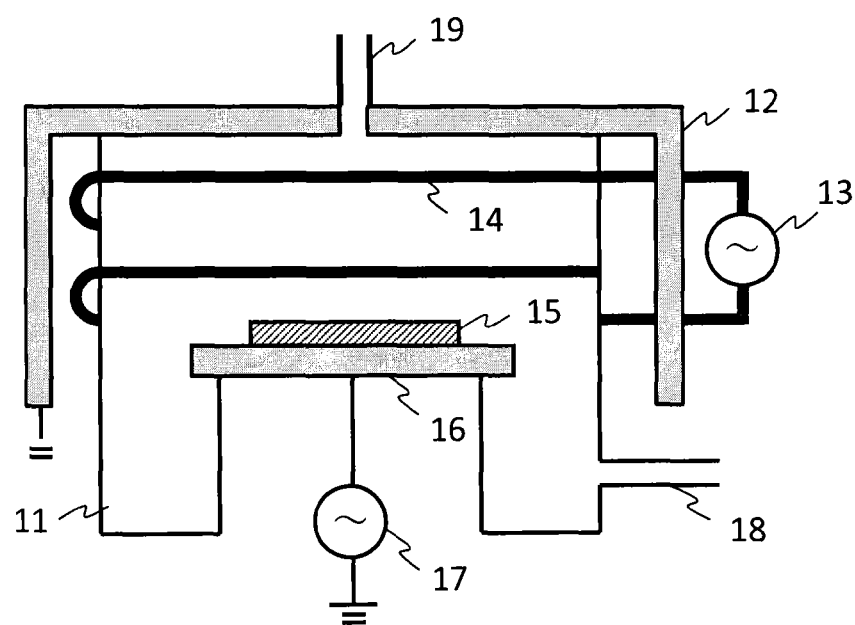
FIG. 6 is a diagram schematically illustrating the configuration of a device used for dry-etching.

FIG. 6 is a diagram schematically illustrating the configuration of a device used for chlorine-containing dry etching including oxygen. In the figure, reference numeral 11 denotes a chamber, 12 denotes a counter electrode, 13 denotes a high frequency oscillator for inductively coupled plasma (ICP), 14 denotes an antenna coil, 15 denotes a sample, 16 denotes a flat electrode, 17 denotes a RIE high frequency oscillator, 18 denotes an exhaust opening, and 19 denotes a gas inlet. FIG. 6 also serves as a diagram schematically illustrating the configuration of a device used for fluorine-containing dry etching as described below.

The dry etching was performed under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator 17, and a power of 400 W (continuous discharge) was supplied to the ICP-generation high frequency oscillator 13.

Clear times of the respective samples of Example 1, Example 2, and Comparative Example when chlorine-containing dry etching including oxygen was performed under the above conditions were obtained from reflectance measurements on these samples. The results are shown in Table 1. Here, the clear times are represented by a value relative to the clear time of a sample in Comparative Example defined as 1.

TABLE 1

| Sample | Sn/Cr (mol/mol) | Clear time (Relative value) |
|---|---|---|
| Example 1 | 0.19 | 0.63 |
| Example 2 | 0.11 | 0.85 |
| Comparative Example | 0.0 | 1 |

As is evident from the above results, the samples of Examples 1 and 2, which contains tin in a CrON film showed an increase in etching rate at the time of chlorine-containing dry etching including oxygen as compared with the sample of Comparative Example, which does not contain Sn.

These samples were compared with one another with respect to the dry-etching rate (clear time) of the CrON film of 44 nm in film thickness. The fluorine-dry etching was performed under the following conditions: The inner pressure of the chamber was set to 5 mTorr, $SF_6$ (18 sccm) and $O_2$ (45 sccm) were supplied as etching gas, a voltage of 54 V (continuous discharge) was applied to the RIE high frequency oscillator 17, and a power of 325 W (continuous discharge) was supplied to the ICP-generation high frequency oscillator 13.

Clear times of the respective samples of Example 1, Example 2, and Comparative Example when fluorine-containing dry etching was performed under the above conditions were obtained from reflectance measurements on these samples. The results are shown in Table 2. Here, the clear time ratio is compared by the ratio of the clear time of the fluorine-containing dry etching to the clear time of the chlorine-containing dry etching including oxygen.

TABLE 2

| Sample | Sn/Cr (mol/mol) | Clear time ratio |
|---|---|---|
| Example 1 | 0.19 | 13.6 |
| Example 2 | 0.11 | 11.1 |
| Example | 0 | 10.3 |

As is evident from the above results, In each of the samples of Examples 1 and 2, which contain tin in the CrON film, in comparison with the sample of Comparative Example, which does not contain Sn, there is an increase in ratio of clear time of the fluorine-containing dry etching to the clear time of the chlorine-containing dry etching including oxygen. Specifically, the ratio between the clear time of the chlorine-containing dry etching including oxygen and the clear time of the fluorine-containing dry etching is 1:11.

EXAMPLES

Example 1

A light-shielding film including a light-shielding layer and an anti-reflection layer was formed on a quartz substrate by using a direct-current sputtering device. As a light-shielding layer, a film (41 nm in film thickness) made of molybdenum, silicon, and nitrogen was formed on the quartz substrate.

Using two different targets, a $MoSi_2$ target and a Si target, as targets, film-formation was performed on the quartz substrate in rotation at 30 rpm. Sputtering gas used was Ar and nitrogen and adjusted so that the inside of a gas chamber could have a gas pressure of 0.05 Pa.

When the composition of this light-shielding film was investigated by ESCA, it was Mo:Si:N=3:1:5 (atomic ratio).

On the light-shielding layer, film-formation of an anti-reflection layer (10 nm in film thickness) made of molybdenum and silicon was performed by using a direct-current sputtering device.

Using two different targets, a $MoSi_2$ target and a Si target, as targets, film-formation was performed on the quartz substrate in rotation at 30 rpm. Sputtering gas used was Ar and nitrogen and adjusted so that the inside of a gas chamber could have a gas pressure of 0.05 Pa.

When the composition of this anti-reflection layer was investigated by ESCA, it was Mo:Sn:N=1:4:3 (atomic ratio).

Using a direct sputtering device, a hard mask film (10 nm in film thickness) was formed on the anti-reflection layer and provided as an etching mask film made of CrSnON.

Using two different targets, a Cr target and a Sn target, as targets, film-formation was performed on the quartz substrate in rotation at 30 rpm. Sputtering gas used was Ar, nitrogen, and oxygen and adjusted so that the inside of a gas chamber could have a gas pressure of 0.1 Pa.

When the composition of this had mask film was investigated by ESCA, it was Cr:Sn:O:N=4:1:5:2 (atomic ratio).

Consequently, there was obtained a photomask blank where the light-shielding film made of MoSiN as a light-shielding film, an anti-reflection layer made of MoSiN, and a film made of CrSnON as an etching mask film are stacked on the quarts substrate.

Subsequently, chemical amplification negative resist was applied 250 nm in thickness, and then subjected to exposure and development to carry out patterning. Next, using this resist pattern as a mask, dry etching was performed with mixture gas of chlorine and oxygen to pattern the etching mask film.

The above etching was performed under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator 17, and a power of 400 W (continuous discharge) was supplied to the ICP-generation high frequency oscillator 13.

Subsequently, using the patterned resist film and hard mask film as masks, the light-shielding film is patterned by fluorine-containing dry etching.

The above etching was performed under the following conditions: The inner pressure of the chamber was set to 5 mTorr, $SF_6$ (185 sccm) and $O_2$ (45 sccm) were supplied as etching gas, a voltage of 54V (continuous discharge) was applied to the RIE high frequency oscillator 17, and a power of 325 W (continuous discharge) was supplied to the ICP-generation high frequency oscillator 13.

Finally, the resist was removed. As a result, a photomask was completed.

Example 2

A half-tone phase shift film (75 nm in film thickness) made of molybdenum, silicon, oxygen, and nitrogen was formed on a quartz substrate by using a direct-current sputtering device.

Using two different targets, a $MoSi_2$ target and a Si target, as targets, film-formation was performed on the quartz substrate in rotation at 30 rpm. Sputtering gas used was Ar and oxygen and adjusted so that the inside of a gas chamber could have a gas pressure of 0.05 Pa.

When the composition of this half-tone phase shift film was investigated by ESCA, it was Mo:Si:O:N=1:4:1:4 (atomic ratio).

Using a direct sputtering device, an etching stopper film (10 nm in film thickness) made of CrSnON was formed on the half-tone phase shift film.

Using two different targets, a Cr target and a Sn target, as targets, film-formation was performed on the quartz substrate in rotation at 30 rpm. Sputtering gas used was Ar, nitrogen, and oxygen and adjusted so that the inside of a gas chamber could have a gas pressure of 0.1 Pa.

When the composition of this etching stopper mask film was investigated by ESCA, it was Cr:Sn:O:N=4:1:5:2 (atomic ratio).

A light-shielding film including a light-shielding layer and an anti-reflection layer was formed on this etching stopper film by using a direct-current sputtering device. As a light-shielding layer, a film (23 nm in film thickness) made of molybdenum, silicon, and nitrogen was formed on the etching stopper film.

Using two different targets, a $MoSi_2$ target and a Si target, as targets, film-formation was performed on the quartz substrate in rotation at 30 rpm. Sputtering gas used was Ar and nitrogen and adjusted so that the inside of a gas chamber could have a gas pressure of 0.05 Pa.

When the composition of this light-shielding layer was investigated by ESCA, it was Mo:Si:N=3:1:5 (atomic ratio).

On the light-shielding layer, film-formation of an anti-reflection layer (10 nm in film thickness) made of molybdenum, silicon, and nitrogen was performed by using a direct-current sputtering device.

Using two different targets, a $MoSi_2$ target and a Si target, as targets, film-formation was performed on the quartz substrate in rotation at 30 rpm. Sputtering gas used was Ar and nitrogen and adjusted so that the inside of a gas chamber could have a gas pressure of 0.05 Pa.

When the composition of this anti-reflection layer was investigated by ESCA, it was Mo:Sn:N=1:4:3 (atomic ratio).

Using a direct sputtering device, a hard mask film (5 nm in film thickness) was formed on the anti-reflection layer and provided as an etching mask film made of CrSnON.

Using two different targets, a Cr target and a Sn target, as targets, film-formation was performed on the quartz substrate in rotation at 30 rpm. Sputtering gas used was argon, nitrogen and oxygen and adjusted so that the inside of a gas chamber could have a gas pressure of 0.1 Pa.

When the composition of this hard mask film was investigated by ESCA, it was Cr:Sn:O:N=4:1:5:2 (atomic ratio).

Thus, a photomask blank was obtained such that a half-tone phase shift film made of MoSiON, an etching stopper film made of CrSnON, a light-shielding layer made of MoSiN and an anti-reflection layer made of MoSiN as light-shielding films, and a hard mask film as an etching mask film made of CrSnON were stacked on the quartz substrate.

Subsequently, chemical amplification negative resist was applied 250 nm in thickness, and then subjected to exposure and development to carry out patterning. Next, using this resist pattern as a mask, dry-etching was performed with mixture gas of chlorine and oxygen to pattern the hard mask film as an etching mask film.

The above etching was performed under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator 17, and a power of 400 W (continuous discharge) was supplied to the ICP-generation high frequency oscillator 13.

Subsequently, using the patterned resist film and hard mask film as masks, the light-shielding film is patterned by carrying out fluorine-containing dry etching.

The above etching was performed under the following conditions: The inner pressure of the chamber was set to 5 mTorr, $SF_6$ (185 sccm) and $O_2$ (45 sccm) were supplied as etching gas, a voltage of 54V (continuous discharge) was applied to the RIE high frequency oscillator 17, and a power of 325 W (continuous discharge) was supplied to the ICP-generation high frequency oscillator 13.

Dry etching was performed using mixture gas of chlorine and oxygen to etch the hard mask film, while simultaneously the etching stopper film was removed.

The above etching was performed under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator 17, and a power of 400 W (continuous discharge) was supplied to the ICP-generation high frequency oscillator 13.

Subsequently, the resist is removed if there is a resist residue. In order to remove the unwanted portion of the light-shielding film, a resist pattern is formed for protecting a portion of the light-shielding film to be left untouched the portion, and then subjected to fluorine-containing dry etching. Then, the half-tone phase shift film is patterned, while simultaneously the unwanted portion of the light-shielding film was removed.

The above etching was performed under the following conditions: The inner pressure of the chamber was set to 5 mTorr, $SF_6$ (185 sccm) and $O_2$ (45 sccm) were supplied as etching gas, a voltage of 54V (continuous discharge) was applied to the RIE high frequency oscillator 17, and a power of 325 W (continuous discharge) was supplied to the ICP-generation high frequency oscillator 13.

Subsequently, the resist is removed. The hard mask film as an etching mask film is removed, As a result, the half-tone phase shift mask was completed.

As described above, the film made a chromium-containing material including tin, which is employed in the present invention, can cause a significant increase in the etching rate at the time of chlorine-containing dry etching. Furthermore, comparing with a film made of a chromium-containing material in which part of chromium is replaced with a light element, the above film has an equal or higher level of etching resistance to fluorine-dry etching.

Thus, at the time of processing a photomask blank according to the present invention, burden on a photoresist at the time of etching the chromium-containing material film can be reduced. Therefore, high-precision pattern transfer can be performed even in the case that the resist film is thinned.

INDUSTRIAL APPLICABILITY

The present invention assures various characteristics such as chemical characteristics required for a hard mask film made of a chromium-containing material and reduces burden on a photoresist at the time of etching the chromium-containing material film, thereby making high-precision pattern transfer possible even in the case that the resist film is thinned.

REFERENCE SIGNS LIST

1 Transparent substrate
2 Light-shielding film
3 Hard mask film
4 Half-tone phase shift film
5 Etching Stopper Film
6 Resist film
7 Resist pattern
11 Chamber
12 Counter electrode
13 High frequency oscillator for ICP development
14 Antenna coil
15 Sample
16 Flat electrode
17 High frequency oscillator for RIE
18 Exhaust opening
19 Gas inlet

The invention claimed is:

1. A photomask blank comprising:
a hard mask film comprising a material comprising chromium and tin, wherein a content of tin is from 0.01 to 2 times a content of chromium in the material, based on an atomic ratio; and
an inorganic material film configured to be etched by fluorine-containing dry etching,
wherein
the hard mask film is disposed on the inorganic material film,
the hard mask film has a thickness of 1 to 30 nm, and
the inorganic material film comprises one or more elements selected from the group consisting of molybdenum, tantalum, hafnium, niobium, tungsten, and silicon.

2. The photomask blank according to claim 1, wherein
the material comprising chromium and tin is selected from the group consisting of a tin-chromium metal, a tin-chromium oxide, a tin-chromium nitride, a tin-chromium carbide, a tin-chromium oxide nitride, a tin-chromium oxide carbide, a tin-chromium nitride carbide, and a tin-chromium oxide nitride carbide.

3. The photomask blank according to claim 1, wherein
the inorganic material film configured to be etched by fluorine-containing dry etching comprises molybdenum and silicon.

4. The photomask blank according to claim 3, wherein
the inorganic material film is a light-shielding film.

5. A method for manufacturing a photomask using the photomask blank according to claim 1, the method comprising:
forming a hard mask pattern by subjecting the hard mask film to chlorine-containing dry etching; and
transferring a pattern to the inorganic material film by fluorine-containing dry etching using the hard mask pattern as an etching mask.

6. The method of manufacturing a photomask blank according to claim 5, wherein
the material comprising chromium and tin is selected from the group consisting of a tin-chromium metal, a tin-chromium oxide, a tin-chromium nitride, a tin-chromium carbide, a tin-chromium oxide nitride, a tin-chromium oxide carbide, a tin-chromium nitride carbide, and a tin-chromium oxide nitride carbide.

7. The method of manufacturing a photomask blank according to claim 5, wherein
the inorganic material film configured to be etched by fluorine-containing dry etching comprises molybdenum and silicon.

8. The method of manufacturing a photomask blank according to claim 5, wherein
the inorganic material film is a light-shielding film.

9. The photomask blank according to claim 1, wherein the material comprising chromium and tin is a tin-chromium metal.

10. The photomask blank according to claim 1, wherein the material comprising chromium and tin is a tin-chromium oxide.

11. The photomask blank according to claim 1, wherein the material comprising chromium and tin is a tin-chromium nitride.

12. The photomask blank according to claim 1, wherein the material comprising chromium and tin is a tin-chromium carbide.

13. The photomask blank according to claim 1, wherein the material comprising chromium and tin is a tin-chromium oxide nitride.

14. The photomask blank according to claim 1, wherein the material comprising chromium and tin is a tin-chromium oxide carbide.

15. The photomask blank according to claim 1, wherein the material comprising chromium and tin is a tin-chromium nitride carbide.

16. The photomask blank according to claim 1, wherein the material comprising chromium and tin is a tin-chromium oxide nitride carbide.

* * * * *